(12) United States Patent
Hicks et al.

(10) Patent No.: US 11,604,713 B2
(45) Date of Patent: Mar. 14, 2023

(54) AUTOMATED HARDWARE FOR INPUT/OUTPUT (I/O) TEST REGRESSION APPARATUS

(71) Applicant: International Business Machines Corporation, Armonk, NY (US)

(72) Inventors: Andrew C. M. Hicks, Wappingers Falls, NY (US); Michael Peter Lyons, Arlington, MA (US); Miles C. Pedrone, Wappingers Falls, NY (US); Tynan J. Garrett, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 16/788,763

(22) Filed: Feb. 12, 2020

(65) Prior Publication Data

US 2021/0248051 A1    Aug. 12, 2021

(51) Int. Cl.
*G06F 11/273* (2006.01)
*G06F 11/22* (2006.01)
(Continued)

(52) U.S. Cl.
CPC .... *G06F 11/2733* (2013.01); *G01R 31/31712* (2013.01); *G06F 11/221* (2013.01); *G06F 11/2268* (2013.01); *G06F 13/20* (2013.01)

(58) Field of Classification Search
CPC .............. G06F 11/2733; G06F 11/221; G06F 11/2268; G01R 31/31712
See application file for complete search history.

(56) References Cited

U.S. PATENT DOCUMENTS 3,585,599 A * 6/1971 Hitt ..................... G06F 11/2733
                                                          714/45
3,825,901 A * 7/1974 Golnek, Sr. ......... G06F 11/2294
                                                          714/25
(Continued)

FOREIGN PATENT DOCUMENTS

TW           I710778 B   * 11/2020
WO        2011087509 A1    7/2011
WO     WO-2018144036 A1  *  8/2018  .............. G06F 11/00

OTHER PUBLICATIONS

W. Bartlett and L. Spainhower, "Commercial fault tolerance: a tale of two systems," in IEEE Transactions on Dependable and Secure Computing, vol. 1, No. 1, pp. 87-96, Jan.-Mar. 2004. (Year: 2004).*
(Continued)

*Primary Examiner* — Matthew M Kim
*Assistant Examiner* — Indranil Chowdhury
(74) *Attorney, Agent, or Firm* — Cantor Colburn LLP; Teddi Maranzano (57) ABSTRACT

A test apparatus is provided for use with a mainframe and an adapter. The test apparatus includes a logical adapter interface unit and a control system. The logical adapter interface unit is interposable between the adapter and the mainframe whereby an I/O signal transmittable from the adapter and to the mainframe is transmitted through the logical adapter interface unit. The logical adapter interface unit is configured to manipulate the I/O signal. The control system is coupled to the logical adapter interface unit and the mainframe and is configured to control manipulations of the I/O signal by the logical adapter interface unit to mimic a condition of I/O traffic being run through the adapter and to log a response of the mainframe to the manipulations.

16 Claims, 3 Drawing Sheets

(51) Int. Cl.
*G06F 13/20* (2006.01)
*G01R 31/317* (2006.01)

(56) References Cited

U.S. PATENT DOCUMENTS

| | | | | |
|---|---|---|---|---|
| 4,817,093 | A * | 3/1989 | Jacobs | G01R 31/318385 |
| | | | | 714/E11.169 |
| 5,283,868 | A * | 2/1994 | Baker | G06F 13/387 |
| | | | | 709/227 |
| 6,157,200 | A * | 12/2000 | Okayasu | G01R 31/31924 |
| | | | | 324/762.02 |
| 6,421,793 | B1 * | 7/2002 | Lester | G06F 11/3692 |
| | | | | 714/37 |
| 6,546,507 | B1 * | 4/2003 | Coyle | G06F 11/221 |
| | | | | 714/E11.161 |
| 6,971,046 | B1 * | 11/2005 | Johnson | G06F 11/273 |
| | | | | 714/25 |
| 7,206,974 | B2 * | 4/2007 | Kozlov | G06F 11/0769 |
| | | | | 714/46 |
| 7,349,526 | B2 | 3/2008 | Urban | |
| 7,884,616 | B2 | 2/2011 | Oruganty | |
| 9,367,432 | B2 | 6/2016 | Jivane et al. | |
| 9,674,342 | B2 | 6/2017 | Koyabe et al. | |
| 9,772,919 | B2 * | 9/2017 | Rajagopal | G06F 11/2733 |
| 10,585,771 | B1 * | 3/2020 | Gheva | G06F 11/3409 |
| 10,642,583 | B2 * | 5/2020 | Cook | G06F 8/41 |
| 11,295,242 | B2 * | 4/2022 | Chang | G06K 9/6267 |
| 2004/0078712 | A1 * | 4/2004 | Rajamani | G06F 11/221 |
| | | | | 714/E11.161 |
| 2007/0174223 | A1 * | 7/2007 | Holmes | G06N 5/025 |
| | | | | 706/47 |
| 2008/0123539 | A1 * | 5/2008 | Johnson | G06F 11/261 |
| | | | | 370/251 |
| 2011/0088014 | A1 * | 4/2011 | Becker | G06F 11/3684 |
| | | | | 717/124 |
| 2014/0237292 | A1 * | 8/2014 | Chan | G06F 11/2733 |
| | | | | 714/32 |
| 2015/0026526 | A1 * | 1/2015 | Mondal | G06F 11/221 |
| | | | | 714/43 |
| 2015/0081614 | A1 * | 3/2015 | Bechet | G06F 11/3692 |
| | | | | 706/52 |
| 2015/0081875 | A1 * | 3/2015 | Ambe | G06F 11/3065 |
| | | | | 709/224 |
| 2016/0196366 | A1 * | 7/2016 | Astigarraga | G06F 30/367 |
| | | | | 703/13 |
| 2018/0032372 | A1 * | 2/2018 | Devendran | G06F 9/45558 |
| 2018/0123923 | A1 * | 5/2018 | Zhou | H04L 45/121 |
| 2018/0286030 | A1 | 10/2018 | Sadasivam et al. | |

OTHER PUBLICATIONS

Bi et al., "Automation of Electrical Cable Harnesses Testing", Robotics, 2017, 13 pages.

* cited by examiner

AUTOMATED HARDWARE FOR INPUT/OUTPUT (I/O) TEST REGRESSION APPARATUS

BACKGROUND

The present invention generally relates to computing resources and, more specifically, to automated hardware for use with an input/output (I/O) test regression apparatus.

When custom hardware that is designed to be used for I/O systems is created, the custom hardware is most often connected to another piece of hardware through a physical wired port. This is particularly true if the custom hardware is provided for high-availability or low-latency solutions.

While physical ports can be straight forward components that can be dragged and dropped into a custom hardware design for I/O systems, it is often the case that a significant amount of care and consideration goes into types of cables that are to be plugged into the physical ports, how the various types of the cables are to be connected and sometimes into how many I/O adapters are connected to the system via the physical ports and in what configuration those I/O adapters are arranged.

In particular, there are many variables that go into the design and the addition of I/O adapters, particularly in mainframe computing environments, and thus there are many configurations of I/O adapters. Of these, many can only be created by operators by hand through time-consuming work. In addition, with each configuration, there are cable performance issues that can come up. These need to be characterized and integrated into on-board firmware.

SUMMARY

Embodiments of the present invention are directed to a test apparatus for use with a mainframe and an adapter. A non-limiting example of the test apparatus includes a logical adapter interface unit and a control system. The logical adapter interface unit is interposable between the adapter and the mainframe whereby an I/O signal transmittable from the adapter and to the mainframe is transmitted through the logical adapter interface unit. The logical adapter interface unit is configured to manipulate the I/O signal. The control system is coupled to the logical adapter interface unit and the mainframe and is configured to control manipulations of the I/O signal by the logical adapter interface unit to mimic a condition of I/O traffic being run through the adapter and to log a response of the mainframe to the manipulations.

Embodiments of the present invention are directed to an input/output (I/O) test apparatus. A non-limiting example of the I/O test apparatus includes a mainframe, an adapter through which I/O traffic is run such that the adapter generates an I/O signal for transmission to the mainframe, a logical adapter interface unit and a control system. The logical adapter interface unit is interposable between the adapter and the mainframe whereby the I/O signal is transmittable from the adapter and to the mainframe through the logical adapter interface unit. The logical adapter interface unit is configured to manipulate the I/O signal. The control system is coupled to the logical adapter interface unit and the mainframe and is configured to control manipulations of the I/O signal by the logical adapter interface unit to mimic a condition of the I/O traffic and to log a response of the mainframe to the manipulations.

Embodiments of the present invention are directed to a method of operating an input/output (I/O) test apparatus in which a logical adapter interface unit is interposed between an adapter and a mainframe. A non-limiting example of the method includes running I/O traffic through the adapter such that the adapter generates an I/O signal for transmission to the mainframe, controlling manipulations of the I/O signal by the logical adapter interface unit to mimic a condition of the I/O traffic and logging a response of the mainframe to the manipulations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

One or more embodiments of the present invention provide for systems and methods for configuring and testing mainframe physical hardware testing environments and thereby allowing for more complete levels of hardware testing and characterization.

Custom hardware is often designed to be installed in mainframe computers and this custom hardware is often provided as new types of adapters that handle input/output (I/O) traffic. These new types of adapters typically connect with certain types of cables that might or might not be optimized for use with the mainframe. Additionally, the cables can have different characteristics when plugged in than anticipated or result in unanticipated results in other aspects of the mainframe computing environment. Once the mainframe computing environment, it can be very challenging to identify the sources of these issues and to take corrective action.

That is, in just a single custom hardware card, there can be many hardware problems that can occur and that can lead to errors. One of the most notable of these, is that the cable can be physically plugged into the adapter improperly or unplugged altogether (e.g., the cable might not be seated 100%, the cable might bend the port, the cable might not make proper connectivity, the cable might be plugged incorrectly, the cable might be too long for the purpose at hand, the cable might be partly broken, the cable might not have the right characteristics, the wires might be of different types with differing transfer properties, connectors might be bent, a cable might be cut, a cable might have different number of lanes or one lane is not active, etc.). Currently, there is no way of gathering data or characteristics within custom hardware that results from each of these situations. In fact, the only way to do this is by having an operator plug and unplug various items in and out of various machines and test special cable cases for each part. This is a very expensive and difficult process that is prone to errors.

Figure 1:
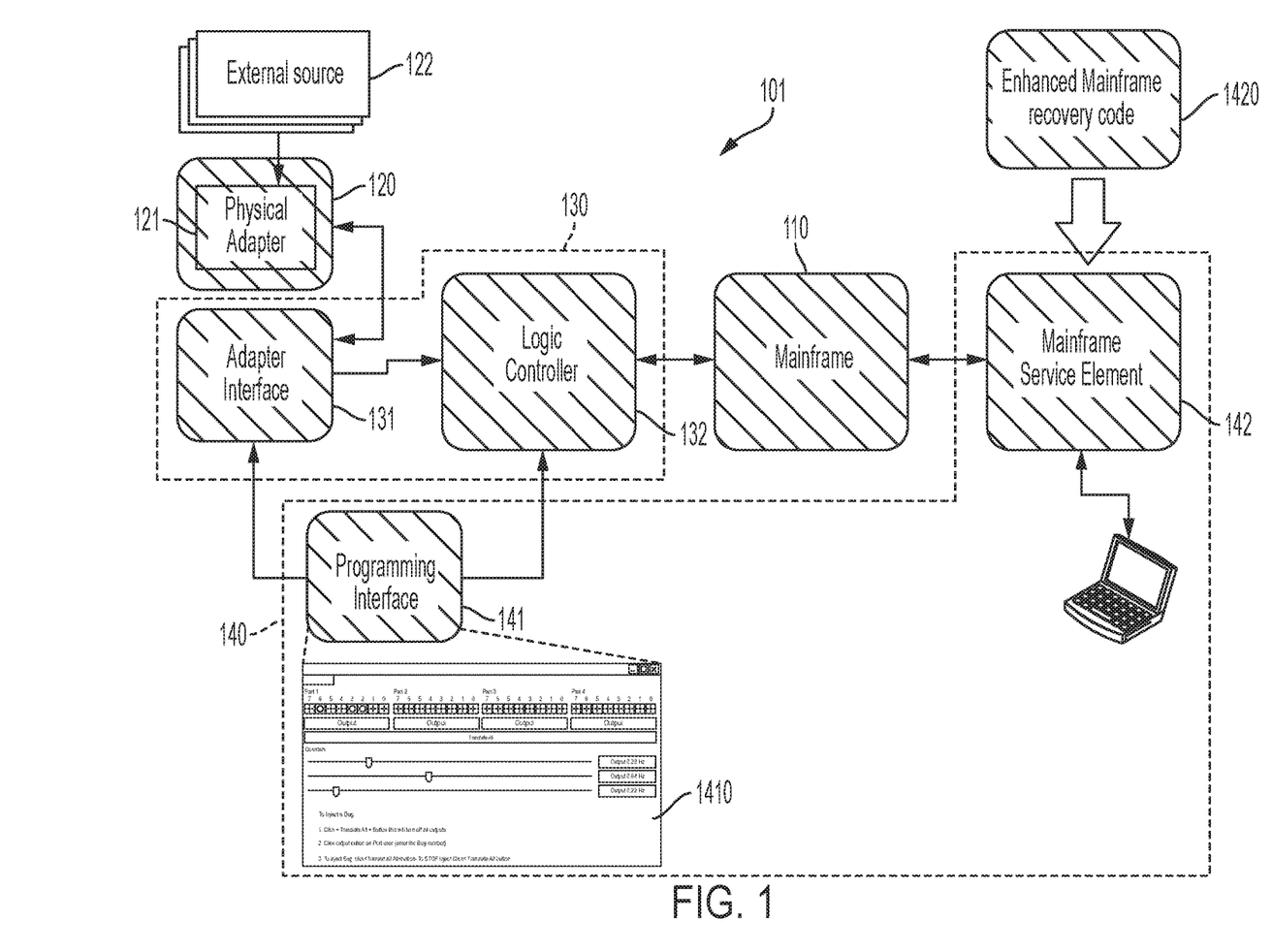
FIG. 1 is a schematic diagram of an input/output (I/O) test apparatus in accordance with embodiments of the present invention.

Turning now to FIG. 1, an I/O test apparatus 101 is provided. The I/O test apparatus 101 includes a mainframe 110, an adapter 120 through which I/O traffic is run such that the adapter 120 generates an I/O signal for transmission to the mainframe 110, a logical adapter interface unit 130 and a control system 140. The logical adapter interface unit 130 is operably interposable between the adapter 120 and the mainframe 110 whereby the I/O signal is transmittable from the adapter 120 and to the mainframe 110 through the logical adapter interface unit 130. The logical adapter interface unit 130 is configured to manipulate the I/O signal. The control system 140 is operably coupled to the logical adapter interface unit 130 and the mainframe 110. The control system 140 is configured to control manipulations of the I/O signal by the logical adapter interface unit 130 to thereby mimic a condition of the I/O traffic and to log a response of the mainframe 110 to the manipulations.

Figure 2:
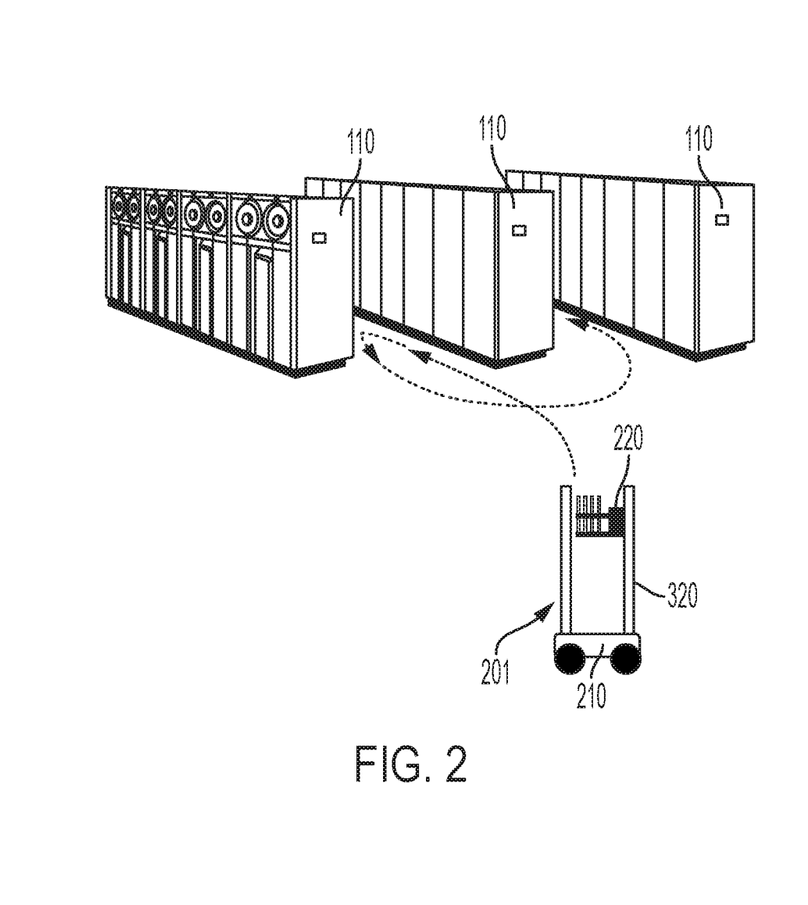
FIG. 2 is a perspective view of a data center in which the I/O test apparatus of FIG. 1 could be deployed in accordance with embodiments of the present invention.

With continued reference to FIG. 1 and with additional reference to FIG. 2, the mainframe 110 can be disposed among one or more other mainframes 110 in any one or more of a data center, a server room, etc., and can be arranged with the one or more other mainframes 110, for example, in rows and columns. In these or other cases, the adapter 120 can include or be provided as one or more physical adapters 121 (see FIG. 1) that are respectively connected to at least one corresponding mainframe 110 and each of the one or more physical adapters 121 can be receptive of the I/O traffic from multiple external sources 122 (see FIG. 1) of one or more various types (e.g., FICON, Ethernet, etc.).

In accordance with embodiments of the present invention, it is to be understood that the logical adapter interface unit 130 of FIG. 1 is operably interposable between each of the one or more physical adapters 121 and the at least one corresponding mainframe 110 of FIG. 2. The following description will, however, relate to the embodiments illustrated in FIG. 1 for purposes of clarity and brevity.

With reference back to FIG. 1, the logical adapter interface unit 130 can include an adapter interface 131, which is connectable with the adapter 120, and a logic controller 132, which is connectable with the mainframe 110. The control system 140 can be, but is not required to be, coupled to the adapter interface 131 and the logic controller 132 in parallel with the direct connection between the adapter interface 131 and the logic controller 132. The control system 140 can includes a programming interface 141 and a service element 142. The programming interface 141 can include or be provided as a control interface and is coupled to the logical adapter interface unit 130 and configured to control the manipulations of the I/O signal by the logical adapter interface unit 130 to mimic the condition of the I/O traffic. The service element 142 can include or be provided as a mainframe service element and is coupled to the mainframe 110 and configured to log the response of the mainframe 110 to the manipulations of the I/O signal by the logical adapter interface unit 130.

In accordance with embodiments, the manipulations of the I/O signal by the logical adapter interface unit 130 can include or be provided as insertions of errors into the I/O signal. In these or other cases, these errors are thus received by the mainframe 110 along with the I/O signal whereupon the mainframe 110 reacts to the I/O signal as well as the errors. How the mainframe 110 reacts to the errors, in particular, can be instructive as to how the mainframe 110 will react to similar errors in the field and this is especially true where the control system 140 controls the logical adapter interface unit 130 to manipulate the I/O signal to mimic conditions of the I/O traffic that might lead to such errors.

For example, to the extent that one of the physical adapters 121 of FIG. 1 can be receptive of I/O traffic from one of the multiple external sources 122 of FIG. 1 over a faulty connection that is not previously known to be in effect in a real world scenario, the mainframe 110 will receive an I/O signal from that physical adapter 121 which has errors included therein and the mainframe 110 will react accordingly in the real world scenario. Meanwhile, if those same errors can have been inserted into the I/O signal by the logical adapter interface unit 130 under the control of the control system 140 during a previous test phase (which preceded the real world scenario) in order to mimic the faulty connection and the mainframe 110 receives that manipulated I/O signal and reacts accordingly, the reaction of the mainframe 110 in the real world scenario can be compared to the reaction of the mainframe 110 during the previous test phase. If the reactions match or are otherwise similar, the faulty connection can be identified as a probable cause and it can be inferred that the faulty connection in the real world scenario is in effect. The faulty connection can then be corrected or otherwise addressed.

In accordance with embodiments of the present invention and as shown in FIG. 1, the programming interface 141 can be presented to an operator or user as a cable characteristic adjuster interface 1410. In these or other cases, the operator or user is able to input commands into the programming interface 141 that instruct the logical adapter interface unit 130 as to how the I/O signal is to be manipulated at any given time or during the course of a test phase. In particular, the cable characteristic adjuster interface 1410 allows the operator or user to effectively inject a "bug" into one or more components of the I/O signal by, for example, turning ports on or off and/or adjusting signal frequencies.

In conventional systems, a faulty connection between an external source and a physical adapter that only presents itself in the form of a reaction of a downstream mainframe could not be so easily identified. In such cases, it is often necessary for an operator to inspect all possible connections that could plausibly cause the reaction of the mainframe in a time-consuming and expensive process.

Figure 3:
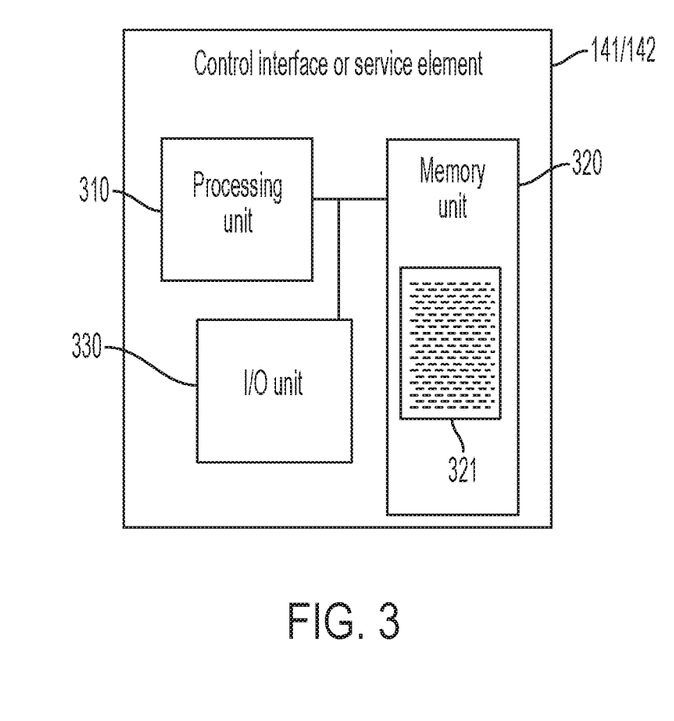
FIG. 3 is a schematic diagram of components of a control system of the I/O test apparatus of FIG. 1 in accordance with embodiments of the present invention.

With reference to FIG. 3, either or both of the programming interface 141 and the service element 142 can be provided as a stand-alone unit, a combined computing device, a component of the mainframe 110 itself, some combination thereof or another suitable feature. In any case, as shown in FIG. 3, at least one of the programming interface 141 and the service element 142 includes a processing unit 310, a memory unit 320, an I/O unit 330 and a communications bus 340 by which the processing unit 310, the memory unit 320 and the I/O unit 330 communicate. The I/O unit 330 provides for communications between the processing unit 310 and external features (i.e., an operator using a graphical user interface (GUI) and the logical adapter interface unit 130 in the case of the programming interface 141 or an operator using a GUI and the mainframe 110 in the case of the service element 142). The memory unit has storage capacity and has executable instructions stored thereon. The executable instructions are readable and executable by the processing unit 310. When the executable instructions are read and executed by the processing unit 310, the executable instructions cause the processing unit 310 to operate as described herein.

In particular, where the processing unit 310 acts as the programming interface 141 of the control system 140, the processing unit 310/programming interface 141 defines one or more conditions of the I/O traffic. That is, the processing unit 310/programming interface 141 recognizes all of the various possible types of issues that could affect the operations of the adapter 120 and the mainframe 110 such as, but not limited to, faulty connections between an external source 122 of FIG. 1 and the adapter 120, and determines which of those types of issues are most likely and thus most appropriately subject to further consideration. In addition, the processing unit 310/programming interface 141 identifies the manipulations which optimally mimic each of the one or more of the conditions of the I/O traffic and causes the logical adapter interface unit 130 to execute the manipulations which optimally mimic each of the one or more of the conditions of the I/O traffic in a predefined sequence that would be known to the service element 142.

In accordance with embodiments of the present invention, the one or more conditions of the I/O traffic can be time-variant such that the manipulations change over time. That is, where the condition of the I/O traffic being mimicked is a faulty connection, for example, the processing unit 310/programming interface 141 recognizes that a healthy connection can degrade over time and that the manipulations will correspondingly change over time. In these or other cases, the processing unit 310/programming interface 141 can be further configured to identify the corresponding changes to the manipulations over time.

Where the processing unit 310 acts as the service element 142 of the control system 140, the processing unit 310/service element 142 logs the response of the mainframe 110 to the manipulations of the I/O signal by the logical adapter interface unit 130, associates the logged responses of the mainframe 110 to the condition of the I/O traffic that are known to have been mimicked by the manipulations and generates a database 321 (see FIG. 3) in accordance with the associations between the logged responses of the mainframe 110 to the condition of the I/O traffic that are known to have been mimicked by the manipulations. This database 321 can be stored in the memory unit 320 and is subsequently accessible to a user of the mainframe 110 or other authorized users in further testing environments or real world scenarios.

In accordance with embodiments of the present invention, the database 321 can be used to correct or otherwise address certain reactions of the mainframe 110 which are indicative of issues such as faulty connections as explained above. In addition, the database 321 can be used to configure and reconfigure a system or custom hardware through identifications of issues present in some instances but not others. For example, where a custom hardware configuration is initially designed with certain cable types being connected to certain physical adapters, it can be found through testing that those cable types might be non-optimal and should be replaced by more optimize cable types.

With reference back to FIG. 2, the I/O test apparatus 101 can further include a robotic tester 201. As shown in FIG. 2, this robotic tester 201 includes a movement system 210, a robotic arm system 220 and a chassis 230 that can be supportive of at least the logical adapter interface unit 130 and the control system 140 of FIG. 1. The movement system 210 is configured such that the robotic tester 201 is movable relative to at least the mainframe 110 and the adapter 120. That is, the robotic tester 201 can be configured to move up and back along rows of the mainframes 110 and the one or more other mainframes 110 to thereby bring the logical adapter interface unit 130 and the control system 140 into the proximity of each. The robotic arm system 220 is configured to connect and disconnect the logical adapter interface unit 130 to and from each of the mainframe 110 and the adapter 120 and to couple and decouple the control system 140 to and from the mainframe 110.

Figure 4:
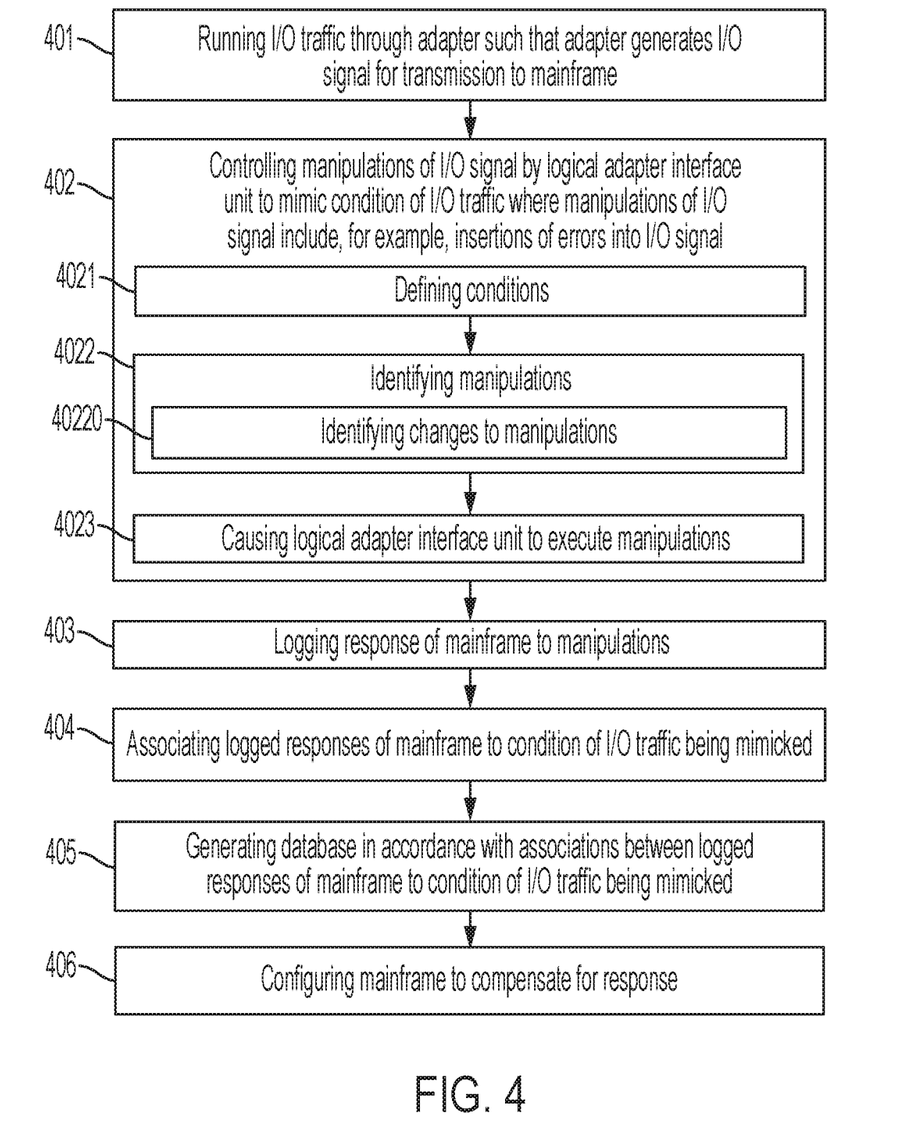
FIG. 4 is a flow diagram illustrating a method of operating the I/O test apparatus of FIG. 1 in accordance with embodiments of the present invention.

With reference to FIG. 4, a method of operating the I/O test apparatus 101 described above is provided. As shown in FIG. 4, the method includes running I/O traffic through the adapter such that the adapter generates an I/O signal for transmission to the mainframe (401), controlling manipulations of the I/O signal by the logical adapter interface unit to mimic a condition of the I/O traffic where the manipulations of the I/O signal include, for example, insertions of errors into the I/O signal (402) and logging a response of the mainframe to the manipulations (403). In addition, the method can include associating logged responses of the mainframe to the condition of the I/O traffic being mimicked (404) and generating a database, which is to be accessible to a user of the mainframe, in accordance with associations between the logged responses of the mainframe to the condition of the I/O traffic being mimicked (405).

In accordance with embodiments of the present invention, the controlling of the manipulations of operation 402 can include defining one or more conditions of the I/O traffic (4021), identifying the manipulations which optimally mimic each of the one or more of the conditions of the I/O traffic (4022) and causing the logical adapter interface unit to execute the manipulations which optimally mimic each of the one or more of the conditions of the I/O traffic in sequence (4023). Here, the one or more conditions can be time-variant, such that the manipulations change over time, and the identifying of the manipulations of operation 4022 can include identifying changes to the manipulations over time (40220).

In accordance with further embodiments of the present invention and with reference back to FIG. 1, the I/O test apparatus 101 described above can be used to appropriately identify the types of errors that could appear with a given system configuration in the field and to modify code of the mainframe 110 to make the code more resilient to errors. As shown in FIG. 1, the service element 142 can be used to apply new or additional code 1420 to the mainframe 110 during certain test cases or based on identified errors over a certain time period from the field. In these or other cases, the new or additional code results in the processing unit(s) of the mainframe 110 having an improved ability to recover from errors.

For example, in an event a certain system configuration is determined to be susceptible to certain types of errors resulting from the flow of I/O traffic through one or more of its physical adapters 121 during a test phase and these errors tend to cause the mainframe 110 to fail or otherwise operate in a non-optimal manner, the new or additional code 1420 can be automatically or manually generated and then uploaded to the mainframe 110 via the service element 142. Once uploaded to the mainframe 110, the new or additional code can provide the mainframe 110 with the ability to recover from the errors by, for example, providing additional routing options for handling the associated I/O traffic and/or seeking alternative routing for the associated I/O traffic.

The effective configuring of the mainframe 110 to compensate for the response of the mainframe to the manipulations by the new or additional code can be included in the method of FIG. 4 (406) as shown in FIG. 4.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A test apparatus for use with a mainframe and an adapter, the test apparatus comprising:
   a logical adapter interface unit interposable between the adapter and the mainframe whereby an input/output (I/O) signal transmittable from the adapter to the mainframe is transmitted through the logical adapter interface unit, the logical adapter interface unit being configured to manipulate the I/O signal; and a control system coupled to the logical adapter interface unit and the mainframe and configured to control manipulations of the I/O signal by the logical adapter interface unit to mimic a condition of I/O traffic being run through the adapter and to log a response of the mainframe to the manipulations, wherein:

the control system inserts errors into the I/O signal to mimic the condition of the I/O traffic, logs a response of the mainframe to insertions of the errors into the I/O signal and uploads new or additional code to the mainframe whereby the mainframe is configured to compensate for the response of the mainframe to the insertions of the errors into the I/O signal such that the mainframe is more resilient to the errors, and the new or additional code provides the mainframe with an ability to recover from the errors by providing additional and alternative routing options for handling the I/O traffic.

2. The test apparatus according to claim 1, wherein the logical adapter interface unit comprises:

an adapter interface which is connectable with the adapter; and a logic controller which is connectable with the mainframe, wherein the control system is coupled to the adapter interface and the logic controller in parallel with a direct connection between the adapter interface and the logic controller.

3. The test apparatus according to claim 1, wherein the control system comprises:

a programming interface coupled to the logical adapter interface unit and configured to control the manipulations of the I/O signal by the logical adapter interface unit to mimic the condition of the I/O traffic; and a service element coupled to the mainframe and configured to log the response of the mainframe to the manipulations.

4. The test apparatus according to claim 3, wherein the programming interface is further configured to:

define one or more conditions of the I/O traffic;

identify the manipulations which optimally mimic each of the one or more of the conditions of the I/O traffic; and cause the logical adapter interface unit to execute the manipulations which optimally mimic each of the one or more of the conditions of the I/O traffic in sequence.

5. The test apparatus according to claim 4, wherein:

the one or more conditions of the I/O traffic are time-variant such that the manipulations change over time, and the programming interface is further configured to identify changes to the manipulations over time.

6. The test apparatus according to claim 3, wherein the service element is further configured to:

associate logged responses of the mainframe to the condition of the I/O traffic being mimicked; and generate a database, which is accessible to a user of the mainframe, in accordance with associations between the logged responses of the mainframe to the condition of the I/O traffic being mimicked.

7. An input/output (I/O) test apparatus, comprising:

a mainframe;

an adapter through which I/O traffic is run such that the adapter generates an I/O signal for transmission to the mainframe;

a logical adapter interface unit interposable between the adapter and the mainframe whereby the I/O signal is transmittable from the adapter to the mainframe through the logical adapter interface unit, the logical adapter interface unit being configured to manipulate the I/O signal; and a control system coupled to the logical adapter interface unit and the mainframe and configured to control manipulations of the I/O signal by the logical adapter interface unit to mimic a condition of the I/O traffic and to log a response of the mainframe to the manipulations, wherein:

the control system inserts errors into the I/O signal to mimic the condition of the I/O traffic, logs a response of the mainframe to insertions of the errors into the I/O signal and uploads new or additional code to the mainframe whereby the mainframe is configured to compensate for the response of the mainframe to the insertions of the errors into the I/O signal such that the mainframe is more resilient to the errors, and the new or additional code provides the mainframe with an ability to recover from the errors by providing additional and alternative routing options for handling the I/O traffic.

8. The I/O test apparatus according to claim 7, wherein:

the adapter comprises one or more physical adapters and the logical adapter interface unit is interposable between each of the one or more physical adapters and the mainframe, and the I/O test apparatus further comprises multiple external sources of one or more types and each of the one or more physical adapters is receptive of the I/O traffic from the multiple external sources of the one or more types.

9. The I/O test apparatus according to claim 7, wherein the logical adapter interface unit comprises:

an adapter interface which is connectable with the adapter; and a logic controller which is connectable with the mainframe, wherein the control system is coupled to the adapter interface and the logic controller in parallel with a direct connection between the adapter interface and the logic controller.

10. The I/O test apparatus according to claim 9, wherein the control system comprises:

a programming interface coupled to the logical adapter interface unit and configured to control the manipulations of the I/O signal by the logical adapter interface unit to mimic the condition of the I/O traffic; and a service element coupled to the mainframe and configured to log the response of the mainframe to the manipulations.

11. The I/O test apparatus according to claim 10, wherein the service element is further configured to:

associate logged responses of the mainframe to the condition of the I/O traffic being mimicked; and generate a database, which is accessible to a user of the mainframe, in accordance with associations between the logged responses of the mainframe to the condition of the I/O traffic being mimicked.

12. The I/O test apparatus according to claim 9, further comprising a robotic tester, which is supportive of the logical adapter interface unit and the control system and movable relative to the mainframe and the adapter, wherein the robotic tester is configured to connect and disconnect the logical adapter interface unit to and from each of the mainframe and the adapter and to couple and decouple the control system to and from the mainframe.

13. A method of operating an input/output (I/O) test apparatus in which a logical adapter interface unit is interposed between an adapter and a mainframe, the method comprising:

running I/O traffic through the adapter such that the adapter generates an I/O signal for transmission to the mainframe;

controlling manipulations of the I/O signal by the logical adapter interface unit to mimic a condition of the I/O traffic; and logging a response of the mainframe to the manipulations, wherein:

the manipulations of the I/O signal comprise insertions of errors into the I/O signal to mimic the condition of the I/O traffic, the logging of the response of the mainframe to the manipulations comprises logging a response of the mainframe to the insertions of the errors into the I/O signal and the method further comprises uploading new or additional code to the mainframe whereby the mainframe is configured to compensate for the response of the mainframe to the insertions of the errors into the I/O signal such that the mainframe is more resilient to the errors, and the new or additional code provides the mainframe with an ability to recover from the errors by providing additional and alternative routing options for handling the I/O traffic.

14. The method according to claim 13, wherein the controlling of the manipulations comprises:

defining one or more conditions of the I/O traffic;

identifying the manipulations which optimally mimic each of the one or more of the conditions of the I/O traffic; and causing the logical adapter interface unit to execute the manipulations which optimally mimic each of the one or more of the conditions of the I/O traffic in sequence.

15. The method according to claim 14, wherein:

the one or more conditions of the I/O traffic are time-variant such that the manipulations change over time, and the identifying of the manipulations comprises identifying changes to the manipulations over time.

16. The method according to claim 13, further comprising:

associating logged responses of the mainframe to the condition of the I/O traffic being mimicked; and generating a database, which is accessible to a user of the mainframe, in accordance with associations between the logged responses of the mainframe to the condition of the I/O traffic being mimicked.

* * * * *